(12) United States Patent
Moyer

(10) Patent No.: US 6,792,105 B1
(45) Date of Patent: Sep. 14, 2004

(54) CURRENT-MODE DIFFERENTIAL ACTIVE HYBRID CIRCUIT

(75) Inventor: Todd K. Moyer, Aurora, OR (US)

(73) Assignee: 3Com Corporation, Santa Clara, CA (US)

( * ) Notice: Subject to any disclaimer, the term of this patent is extended or adjusted under 35 U.S.C. 154(b) by 702 days.

(21) Appl. No.: 09/703,175

(22) Filed: Oct. 31, 2000

(51) Int. Cl.[7] .......................... H04M 1/00; H04M 9/00; H04M 9/08
(52) U.S. Cl. ...................... 379/402; 379/344; 379/345; 379/395; 379/405; 379/413.02; 379/416; 379/417
(58) Field of Search ................................ 379/344, 345, 379/395, 402, 405, 413.02, 416, 417

(56) References Cited

U.S. PATENT DOCUMENTS

| | | | | |
|---|---|---|---|---|
| 3,849,609 A | 11/1974 | Voorman | ..................... | 179/170 |
| 4,004,109 A | 1/1977 | Boxall | ........................ | 179/170 |
| 4,041,252 A * | 8/1977 | Cowden | ..................... | 379/405 |
| 4,203,012 A | 5/1980 | Boxall | ........................ | 179/170 |
| 4,301,336 A | 11/1981 | Müting | ........................ | 179/170 |
| 4,375,015 A | 2/1983 | Chambers, Jr. | ............. | 179/170 |
| 4,798,982 A | 1/1989 | Voorman | ..................... | 307/490 |
| 5,280,526 A | 1/1994 | Laturell | ...................... | 379/405 |
| 5,479,504 A | 12/1995 | Nakano et al. | ............. | 379/402 |
| 6,556,628 B1 * | 4/2003 | Poulton et al. | ............. | 375/257 |

OTHER PUBLICATIONS

Eduard Sackinger et al, "A Versatile Building Block: The CMOS Differential Difference Amplifier", *IEEE Journal of Solid–State Circuits,* vol. SC–22, No. 2, Apr. 1987, pp. 287–294 and VI–6 and VI–7.

* cited by examiner

Primary Examiner—Curtis Kuntz
Assistant Examiner—Alexander Jamal
(74) Attorney, Agent, or Firm—Michaelson & Associates; Peter L. Michaelson

(57) ABSTRACT

In at least one embodiment, a current mode differential active hybrid circuit having an H-bridge output driver with a first output resistor coupled across a transmission medium output. Drive circuitry is coupled to the output H-bridge and constructed to supply data modulated signals to the output H-bridge. A second H-bridge is coupled to the drive circuitry in parallel with the output H-bridge to allow a second output across a second output resistor.

30 Claims, 2 Drawing Sheets

CURRENT-MODE DIFFERENTIAL ACTIVE HYBRID CIRCUIT

BACKGROUND

A hybrid circuit is used to transmit and receive signals simultaneously along the same medium. For example, twisted-pair cable is used in the public telephone network to carry signals in both directions between two people talking. A single pair of wires carries both signals. Similarly, in Ethernet transmission over copper wires, each of four pairs of wire in a Category 5 cable is used to carry signals in both directions simultaneously.

A hybrid circuit is necessary because the transmitter and the receiver can not simply be tied together at each end of the cable. If this were done, the transmit signal would severely interfere with the received signal, particularly if the receive signal has been significantly attenuated by the cable. Thus, some means must be used to cancel the transmit signal at the receiver input so that just the receive signal can be recovered, while still allowing the transmit signal to be applied to the cable.

Conventional hybrid circuits can be passive, constructed of various coils arranged so as to achieve the necessary cancellation of the transmit signal. Another type of conventional hybrid circuit employs operational amplifiers as disclosed in U.S. Pat. No. 5,479,504, by Nakano et al., herein incorporated by reference in its entirety.

The hybrid circuit disclosed in Nakano et al. is a voltage mode device in that it utilizes a voltage output for the transmitter with series termination resistors to terminate the medium as well as to isolate the transmit circuit from the receive circuit. Such a topology relies on low output impedance voltage drivers so that the receive signal is significantly attenuated at the transmitter output. In such a circuit the transmit signal, free from the receive signal, is available so that it can be subtracted from the combined transmit and receive signal that appears at the interface to the medium.

One drawback of the above referenced hybrid circuit is that it is not ideal for implementation in mass produced high speed communication circuits. As such, a new circuit topology capable of use in integrated communication circuits transmitting up to 1 Gigabit per second or faster is needed.

Further, it would be desirable if such a topology allowed a controlled, stable impedance (termination) to a transmission medium. Also, it would be desirable if some implementations allowed a differential receive signal coming from the medium to pass with minimal loss to a single ended node VRX. Moreover, it would be desirable if the transmit signal were allowed to pass with low loss to the medium. In addition, it would be desirable to efficiently cancel the transmit signal from the recovered receive signal.

SUMMARY

At least one embodiment of the present invention utilizes, a current mode differential active hybrid circuit having an H-bridge output driver with a first output resistor coupled across a transmission medium output. Drive circuitry is coupled to the output H-bridge and constructed to supply data modulated signals to the output H-bridge. A second H-bridge is coupled to the drive circuitry in parallel with the output H-bridge to allow a second output across a second output resistor.

DETAILED DESCRIPTION

Figure 1:
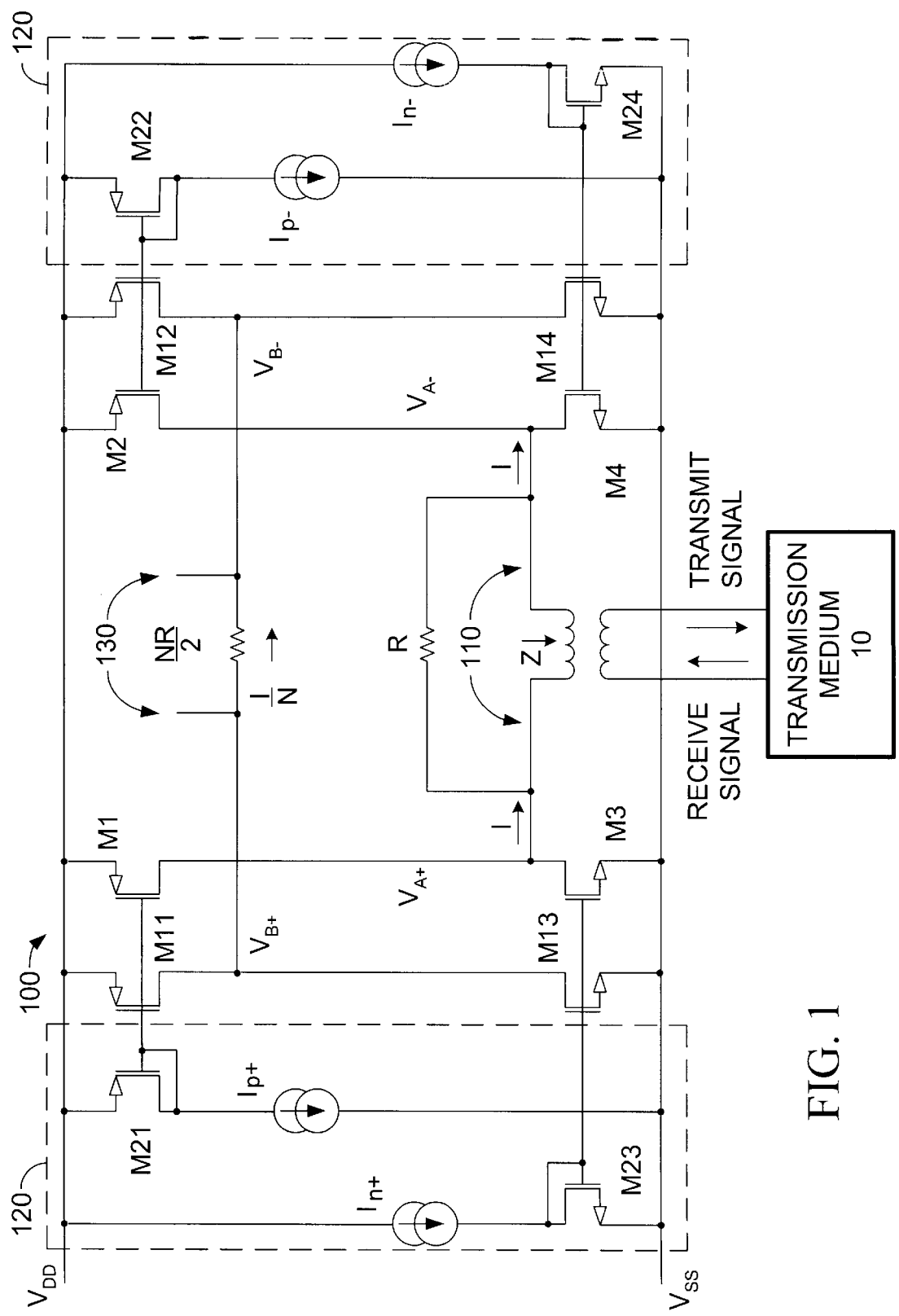
FIG. 1 shows an current mode differential active hybrid circuit embodiment in accordance with the present invention.

Turning to FIG. 1, in one implementation of the present invention, a hybrid circuit 100 is provided to transmit and receive signals simultaneously. Transmitter output devices M1 through M4 are configured in what can be referred to as an H-bridge output driver. The H-bridge is configured to provide a differential signal, balanced with respect to ground, for transmission over a transmission medium 10.

An output resistor R is coupled across a transmission output 110, such as a transformer, which is coupled to the transmission medium 10. The transmission output 110 may have a resistance R that substantially matches the output impedance Z presented by the transmission output 110. In the case of a transformer presenting a 100 ohm output impedance, the output resistor R preferably would be selected at 100 ohms.

Drive circuitry 120 is coupled to the H-bridge output circuit. The drive circuitry 120 is constructed to supply data modulated signals to the H-bridge output driver. In the embodiment of FIG. 1, the drive for the output devices M1 through M4 of the H-bridge output comes from current sources $I_{p+}$, $I_{p-}$, $I_{n+}$, and $I_{n-}$, respectively. The signal currents are forced through diode-connected devices M21 through M24, respectively. The diode-connected devices M21 through M24 develop gate voltages to be applied to the output devices M1 through M4, respectively.

The embodiment of FIG. 1 allows a hybrid circuit to be constructed with high impedance output devices M1 through M4, such as metal-oxide-semiconductor or MOS transistors, in the output or transmit portion of the hybrid. Because of their high impedance, the output devices M1 through M4 can best be characterized as current outputs instead of voltage outputs. The problem with a current mode output for a hybrid circuit, is that unlike with voltage mode outputs discussed above, no transmit voltage signal is explicitly available at the output for use to recover the receive signal. This is because the transmit signal is not available free from the receive signal at the output.

To overcome this, the embodiment of FIG. 1 provides an active reconstruction circuit in parallel with the output H-bridge circuit. The reconstruction circuit, reconstructs or emulates the transmission signal that is generated by the output H-bridge. In the embodiment of FIG. 1, the reconstruction circuit is a second H-bridge, M11 through M14, coupled to the driver circuitry 120 in parallel with the output H-bridge, M1 through M4. As such, in this implementation, the reconstruction circuit is driven by the same driver circuitry 120 as the output H-bridge and provides an accurate reconstruction of the transmit signal which is provided to the transmission output 110.

In one implementation transistors M11 through M14 are ratio-matched to the output devices M1 through M4, respectively. Thus, they have the same gate length, but a total width of 1/N times the width of the output devices to which they are matched. So, for instance, M11 has a W/L ratio represented by $\exists_p$, while M1, the output device that is ratio-matched to M11, has a W/L ratio given by $N\exists_p$, where N is a positive integer, typically about 5–10. Note that if complementary metal oxide semiconductor or CMOS transistors are utilized, the n-channel transistors need not have the same total width as the p-channel transistors, just the ratio N must be the same.

Thus, if we assume differential operation and for now ignore any received voltage from the medium (this can be done, by the principle of superposition, as long as the circuit remains linear), the signal currents $I_{p+}$, $I_{p-}$, $I_{n+}$, $I_{n-}$ will be generated such that output current I flows through the load, made up of resistor R and the transformer coupled to the transmission medium 10. The transformer presents an impedance Z to the transmitter. That, in parallel with load resistor R makes a total load impedance of R*Z/(R+Z). Further, if we assume the ideal case, then Z=R, and the total load impedance is R/2. Then the output voltage $V_A = (V_{A+} - V_{A-}) = RI/2$.

Since the reconstruction transistors, M11 through M14, have the same gate-to-source voltages VGS as transistors M1 through M4, respectively, they will mirror the currents out of M1 through M4 multiplied by factor 1/N. Then, the current through load 130 of the second H-bridge, chosen as NR/2, will be I/N.

The load 130 of the second H-bridge conveniently may be selected as NR/2 to match to the impedance of R in parallel with Z, multiplied by the factor N. If this is done, the output voltage of the second H-bridge $V_B (=V_{B+}-V_{B-})$, will equal the output voltage $V_A$. This facilitates operation of the hybrid 100.

Figure 2:
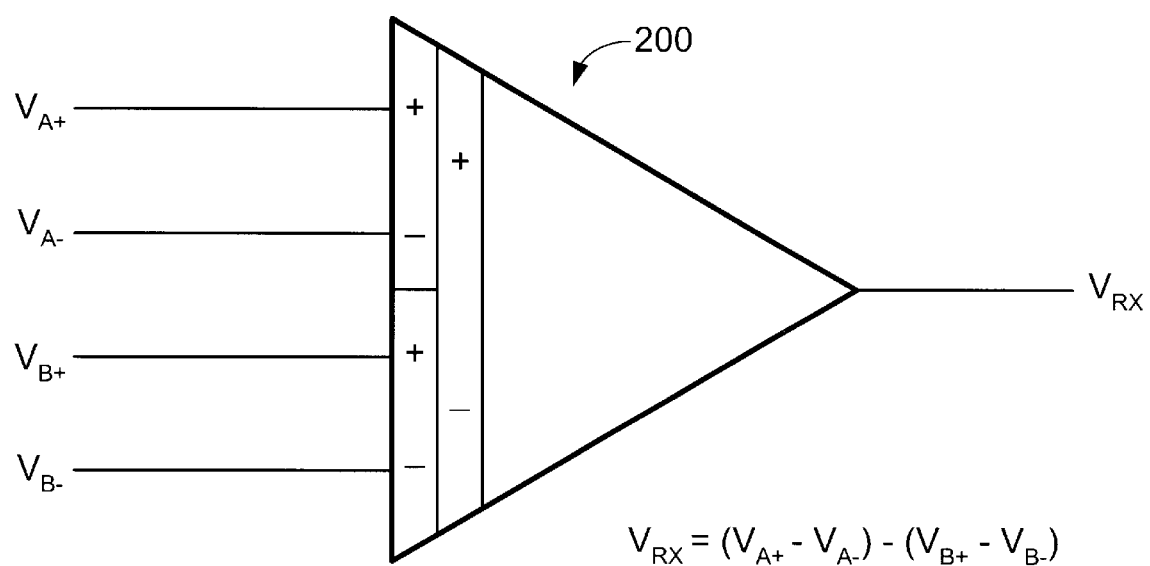
FIG. 2 shows a dual differential amplifier capable of use with some embodiments of the current mode differential active hybrid circuit of FIG. 1.

Turning to FIG. 2, a differential difference amplifier or dda 200 may be utilized to provide a receive signal $V_{RX}$ from the mixed transmit/receive signals $V_A$, and the reconstructed transmit signal $V_B$. As such the differential output voltages $V_{A+}$ and $V_{A-}$ and the reconstructed differential output voltages $V_{B+}$ and $V_{B-}$ are coupled to the differential difference amplifier 200 which produces a received voltage signal $V_{RX}$. The differential difference amplifier 200 essentially subtracts differential voltage $V_B$ from differential voltage $V_A$ to produce single-ended output $V_{RX}$. As noted previously, the reconstructed transmitter voltage $V_B$ should be equal to the transmitter voltage $V_A$; therefore, the difference between the 2 voltages is zero, and the transmit signal is canceled to produce $V_{RX}$. Differential difference amplifiers are well known in the art and commercially available. An example of a CMOS differential difference amplifier circuit may be found in a publication by Sackinger and Guggenbuhl, entitled A Versatile Building Block: The CMOS Differential Amplifier, printed in *IEEE Journal of Solid State Circuits*, April 1987, Vol. SC-22, No. 2, pp. 287–294, herein incorporated by reference.

Referring to FIG. 1, the hybrid circuit 100 of FIG. 1 properly terminates the transmission medium and effectively couples the received signal from the medium to recovery circuitry. From FIG. 1 it can be observed that the termination seen by the medium is approximately the resistance R, if the assumption is made that the output impedance of the transistors is very high relative to R. In this implementation, there is complete freedom to select R to match the characteristic impedance of the transmission medium. It is also apparent that the received signal can be directly coupled to the dda on the $V_A$ port. If we assume the transmitter is inactive (valid by superposition), the voltage $V_B$ will be zero and $V_{RX}=V_A$. Therefore, the receive signal is effectively coupled to the single-ended signal $V_{RX}$ without loss.

The implementation of FIG. 1 allows current mode devices to be used if desired. Whereas conventional hybrid circuit topology uses voltage drivers for the transmitter along with series termination resistors to terminate the medium, as well as to isolate the transmit circuit from the receive circuit, such as is described by Nakano et al, U.S. Pat. No. 5,479,504, the implementation of FIG. 1 allows utilization of current mode devices. Use of the reconstruction circuit, implemented in at least one embodiment by the parallel coupled second H-bridge, M11 through M14, gets around multiple problems with previous circuits, particularly if they were to be implemented in a CMOS integrated circuit. Further, the implementation of FIG. 1 allows the output devices to be connected directly to the medium if desired, without series resistance for isolation.

As discussed above, the implementation of FIG. 1 is particularly useful for implementation with CMOS integrated circuits. Because of the low transconductance of MOS transistors, it is less practical to provide the high-speed, low output impedance voltage drivers necessary for many applications, particularly if a voltage-mode output were to be used. On the other hand, MOS transistors work well for current-mode output drivers. The implementation of FIG. 1 allows this property to be exploited without the drawbacks that would otherwise encountered with other circuit topologies. Further, if desired, it allows current-mode output while still achieving the cancellation required of a hybrid circuit.

The implementation of FIG. 1 is suited for matched transistor devices as discussed above. As such, it may be more easily implemented with transistors built on a monolithic integrated circuit, which typically have more device uniformity and allow more accurate matching of similar devices. Further, in some embodiments, it may be desirable to provide the driver circuitry and the dda from the same monolithic devices, such as with MOS type devices.

Although the invention is well suited to implementation in CMOS technology, it could be built with bipolar transistors. Further, it does not require complementary transistors. It could be implemented with just n-channel MOSFET's or with NPN bipolar transistors. For example, M1 and M2 could be replaced with pull-up resistors in a unipolar type implementation. In such an implementation, each of the pull-up resistors could have a value of R/2. Or instead, M3 and M4 likewise could be replaced with pull-down resistors.

While the preferred methods and embodiments of the present invention have been described in detail above, many changes to these embodiments may be made without departing from the true scope and teachings of the present invention. The present invention, therefore, is limited only as claimed below and the equivalents thereof.

What is claimed is:

1. A current mode differential active hybrid circuit comprising:

an output H-bridge having an output driver, comprising first transistors, and a first output resistor coupled across a transmission medium output;

drive circuitry, coupled to the output H-bridge, to supply data modulated signals to the output H-bridge, wherein the drive circuitry comprises:

a plurality of current sources capable of providing data modulated current signals; and a plurality of diode-connected transistors, with each one of the diode-connected transistors being coupled to a respective one of the plurality of current sources and to a respective one of the first transistors so as to be capable of providing a drive voltage to the respective one transistor responsive to a respective data modulated current signal; and a second H-bridge comprising second transistors and a second output resistor, the second H-bridge being coupled to the drive circuitry in parallel with the output H-bridge, the second transistors being coupled to the plurality of diode-connected transistors in parallel with the output H-bridge.

2. The circuit of claim 1 wherein the first and second transistors comprise MOS transistors.

3. The circuit of claim 2 wherein the first and second transistors are ratio matched.

4. The circuit of claim 3 wherein the first and second transistors have a same gate length, and the first transistors have a gate width of N times a gate width of the second transistors.

5. The circuit of claim 4 wherein the first output resistor has a resistance substantially the same as a characteristic impedance of the transmission medium output, and wherein the second output resistor has a resistance equal to one-half a product of the resistance of the first output resistor multiplied by a ratio of the gate width of the first transistors to the gate width of the second transistors.

6. The circuit of claim 5 wherein all the first and second transistors and the diode-connected transistors comprise CMOS transistors.

7. The circuit of claim 6 wherein the plurality of current sources comprises two sets of differential current sources.

8. The circuit of claim 1 wherein both the first and second transistors comprise N-type and P-type CMOS transistors.

9. The circuit of claim 8 wherein all the first and second transistors and the diode-connected transistors comprise MOS transistors.

10. The circuit of claim 1 wherein the plurality of current sources comprises two sets of differential current sources.

11. A current mode differential active hybrid circuit comprising:
an output H-bridge having an output driver, comprising first transistors, and a first output resistor coupled across a transmission medium output;
drive circuitry, coupled to the output H-bridge, to supply data modulated signals to the output H-bridge;
a second H-bridge comprising second transistors and a second output resistor, the second H-bridge being coupled to the drive circuitry in parallel with the output H-bridge; and
wherein:
the first and second transistors comprise ratio-matched MOS transistors, with the first transistors having a gate width of N times a gate width of the second transistors; and
the first output resistor has a resistance substantially the same as a characteristic impedance of the transmission medium output, and the second output resistor has a resistance equal to one-half a product of the resistance of the first output resistor multiplied by a ratio of the gate width of the first transistors to the gate width of the second transistors.

12. The circuit of claim 11 wherein all the first and second transistors comprise CMOS transistors.

13. A circuit for generating and recovering signals from a differential transmission line adapted to simultaneously carry receive signals and transmit signals, the circuit comprising:
a current mode differential active hybrid circuit comprising:
an output H-bridge having an output driver, comprising first transistors, and a first output resistor coupled across a transmission medium output;
drive circuitry, coupled to the output H-bridge, to supply data modulated signals to the output H-bridge; and
a second H-bridge, comprising second transistors, and a second output resistor, the second H-bridge being coupled to the drive circuitry in parallel with the output H-bridge; and
wherein:
the first and second transistors comprise ratio-matched MOS transistors, and have the same gate length, and the first transistors have a gate width of N times a gate width of the second transistors; and
the first output resistor has an output resistance substantially the same as the characteristic impedance of the transmission medium output, and wherein the second output resistor has a resistance equal to one-half a product of the resistance of the first output resistor multiplied by a ratio of the gate width of the first transistors to the gate width of the second transistors; and
a differential difference amplifier capable of subtracting two sets of differential signals and providing therefrom a single ended output, the differential difference amplifier comprising two inputs coupled to receive a differential output from the output H-bridge and two inputs coupled to receive a differential output from the second H-bridge so as be capable of providing at the single ended output a receive signal recovered from the transmission line.

14. The circuit of claim 13 wherein the drive circuitry comprises:
a plurality of current sources capable of providing data modulated current signals; and
a plurality of diode-connected transistors, with each one of the diode-connected transistors being coupled to a respective one of the plurality of current sources and to a respective one of the first transistors so as to be capable of providing a drive voltage to the respective one transistor responsive to a respective data modulated current signal; and
wherein the second transistors are coupled to the plurality of diode-connected transistors in parallel with the output H-bridge.

15. The circuit of claim 14 wherein all the first and second transistors and the diode-connected transistors comprise CMOS transistors.

16. The circuit of claim 15 wherein the two inputs coupled to the output H-bridge are coupled on either side of the first output resistor, and wherein the two inputs coupled to the second H-bridge are coupled on either side of the second output resistor.

17. The circuit of claim 16 wherein the plurality of current sources comprises two sets of differential current sources.

18. A current mode differential active hybrid circuit comprising:
an output H-bridge having an output driver, comprising first transistors, and a first output resistor coupled across a transmission medium output;
drive circuitry, coupled to the output H-bridge, to supply data modulated signals to the output H-bridge;
a second H-bridge comprising second transistors and a second output resistor, the second H-bridge being coupled to the drive circuitry in parallel with the output H-bridge; and
wherein the first output resistor has a resistance substantially the same as a characteristic impedance of the transmission medium output, and the second output resistor has a resistance equal to one-half a product of the resistance of the first output resistor multiplied by a ratio of the gate width of the first transistors to the gate width of the second transistors.

19. The circuit of claim 18 wherein the first and second transistors comprise MOS transistors.

20. The circuit of claim 18 wherein the first and second transistors are ratio matched.

21. The circuit of claim 20 wherein the first transistors have a gate width of N times a gate width of the second transistors.

22. The circuit of claim 21 wherein all the first and second transistors comprise CMOS transistors.

23. A circuit for generating and recovering signals from a differential transmission line adapted to simultaneously carry receive signals and transmit signals, the circuit comprising:

a current mode differential active hybrid circuit comprising:

an output H-bridge having an output driver, comprising first transistors, and a first output resistor coupled across a transmission medium output;

drive circuitry, coupled to the output H-bridge, to supply data modulated signals to the output H-bridge; and a second H-bridge, comprising second transistors, and a second output resistor, the second H-bridge being coupled to the drive circuitry in parallel with the output H-bridge; and wherein the first output resistor has an output resistance substantially the same as the characteristic impedance of the transmission medium output, and the second output resistor has a resistance equal to one-half a product of the resistance of the first output resistor multiplied by a ratio of the gate width of the first transistors to the gate width of the second transistors; and a differential difference amplifier capable of subtracting two sets of differential signals and providing therefrom a single ended output, the differential difference amplifier comprising two inputs coupled to receive a differential output from the output H-bridge and two inputs coupled to receive a differential output from the second H-bridge so as be capable of providing at the single ended output a receive signal recovered from the transmission line.

24. The circuit of claim 23 wherein the first and second transistors comprise MOS transistors.

25. The circuit of claim 24 wherein the first and second transistors are ratio matched.

26. The circuit of claim 25 wherein the first and second transistors have the same gate length, and the first transistors have a gate width of N times a gate width of the second transistors.

27. The circuit of claim 26 wherein the drive circuitry comprises:

a plurality of current sources capable of providing data modulated current signals; and a plurality of diode-connected transistors, with each one of the diode-connected transistors being coupled to a respective, one of the plurality of current sources and to a respective one of the first transistors so as to be capable of providing a drive voltage to the respective one transistor responsive to a respective data modulated current signal; and, wherein the second transistors are coupled to the plurality of diode-connected transistors in parallel with the output H-bridge.

28. The circuit of claim 27 wherein all the first and second transistors and the diode-connected transistors comprise CMOS transistors.

29. The circuit of claim 28 wherein the two inputs coupled to the output H-bridge are coupled on either side of the first output resistor, and wherein the two inputs coupled to the second H-bridge are coupled on either side of the second output resistor.

30. The circuit of claim 29 wherein the plurality of current sources comprises two sets of differential current sources.

* * * * *